United States Patent
Iwata

(10) Patent No.: US 7,292,468 B2
(45) Date of Patent: Nov. 6, 2007

(54) MAGNETIC RANDOM ACCESS MEMORY

(75) Inventor: Yoshihisa Iwata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/194,534

(22) Filed: Aug. 2, 2005

(65) Prior Publication Data

US 2006/0274573 A1    Dec. 7, 2006

(30) Foreign Application Priority Data

Jun. 7, 2005   (JP) ............................. 2005-166950

(51) Int. Cl.
*G11C 11/00*    (2006.01)
(52) U.S. Cl. ................................... 365/158
(58) Field of Classification Search ................. 365/158
See application file for complete search history.

(56) References Cited

U.S. PATENT DOCUMENTS 6,445,612 B1 *  9/2002  Naji ........................... 365/158
6,587,371 B1 *  7/2003  Hidaka ...................... 365/173
6,914,808 B2 *  7/2005  Inaba ......................... 365/158
2003/0081453 A1 *  5/2003  Hidaka ...................... 365/173
2004/0170052 A1 *  9/2004  Inui ........................... 365/158
2004/0208052 A1 * 10/2004  Hidaka ...................... 365/158
2006/0139991 A1 *  6/2006  Aoki .......................... 365/158

OTHER PUBLICATIONS

Peter K. Naji, et al., "A 256kb 3.0V 1T1MTJ Nonvolatile Magnetoresistive RAM", ISSCC Digest of Technical Papers, Feb. 2001, pp. 122-123.
Roy Scheuerlein, et al., "A 10ns Read and Write Non-Volatile Memory Array Using a Magnetic Tunnel Junction and FET Switch in Each Cell", ISSCC Digest of Technical Papers, 2000, pp. 128-129.

* cited by examiner

*Primary Examiner*—Huan Hoang
*Assistant Examiner*—Anthan T Tran
(74) *Attorney, Agent, or Firm*—Oblon, Spivak, McClelland, Maier & Neustadt, P.C.

(57) ABSTRACT

A magnetic random access memory includes a first magnetoresistive element which is used as a memory element, and a second magnetoresistive element which is used as a current load of a read bias circuit.

11 Claims, 8 Drawing Sheets

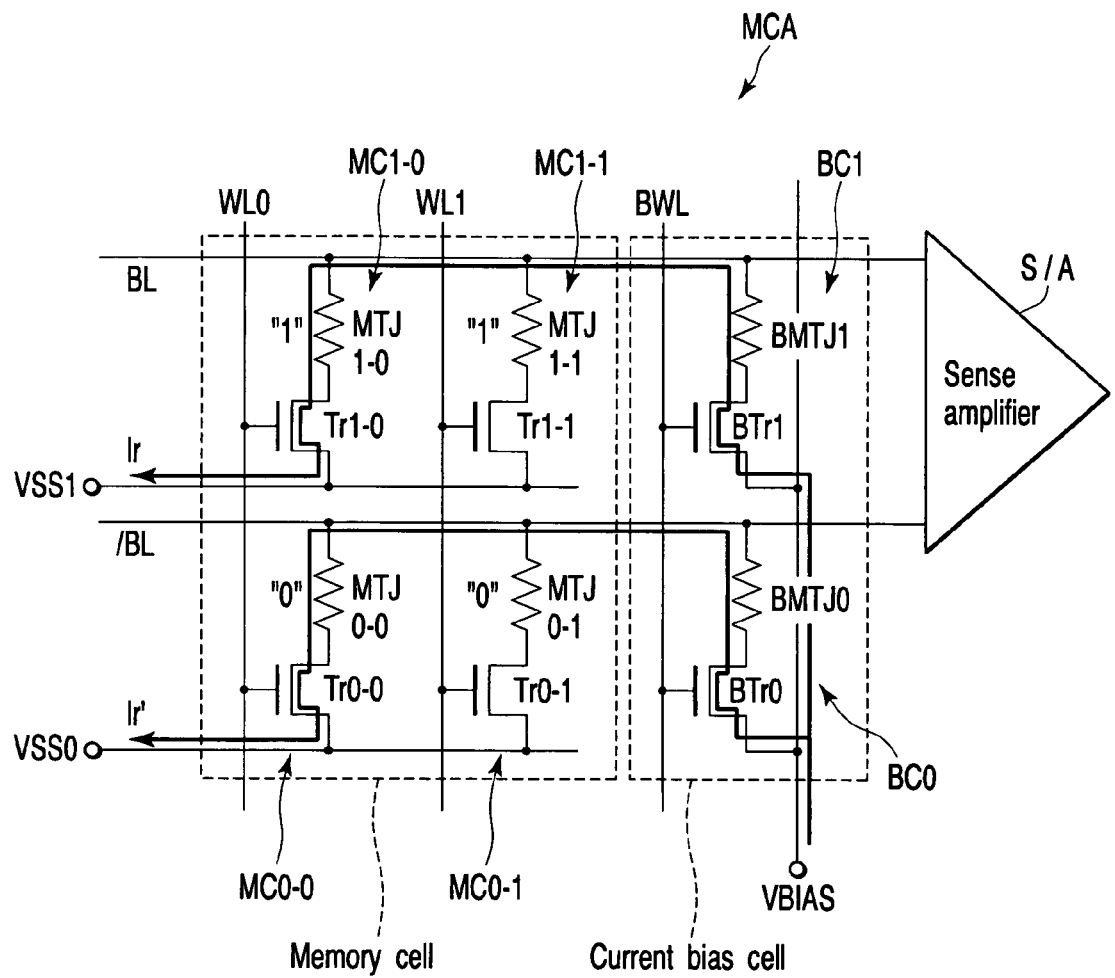
F I G. 1

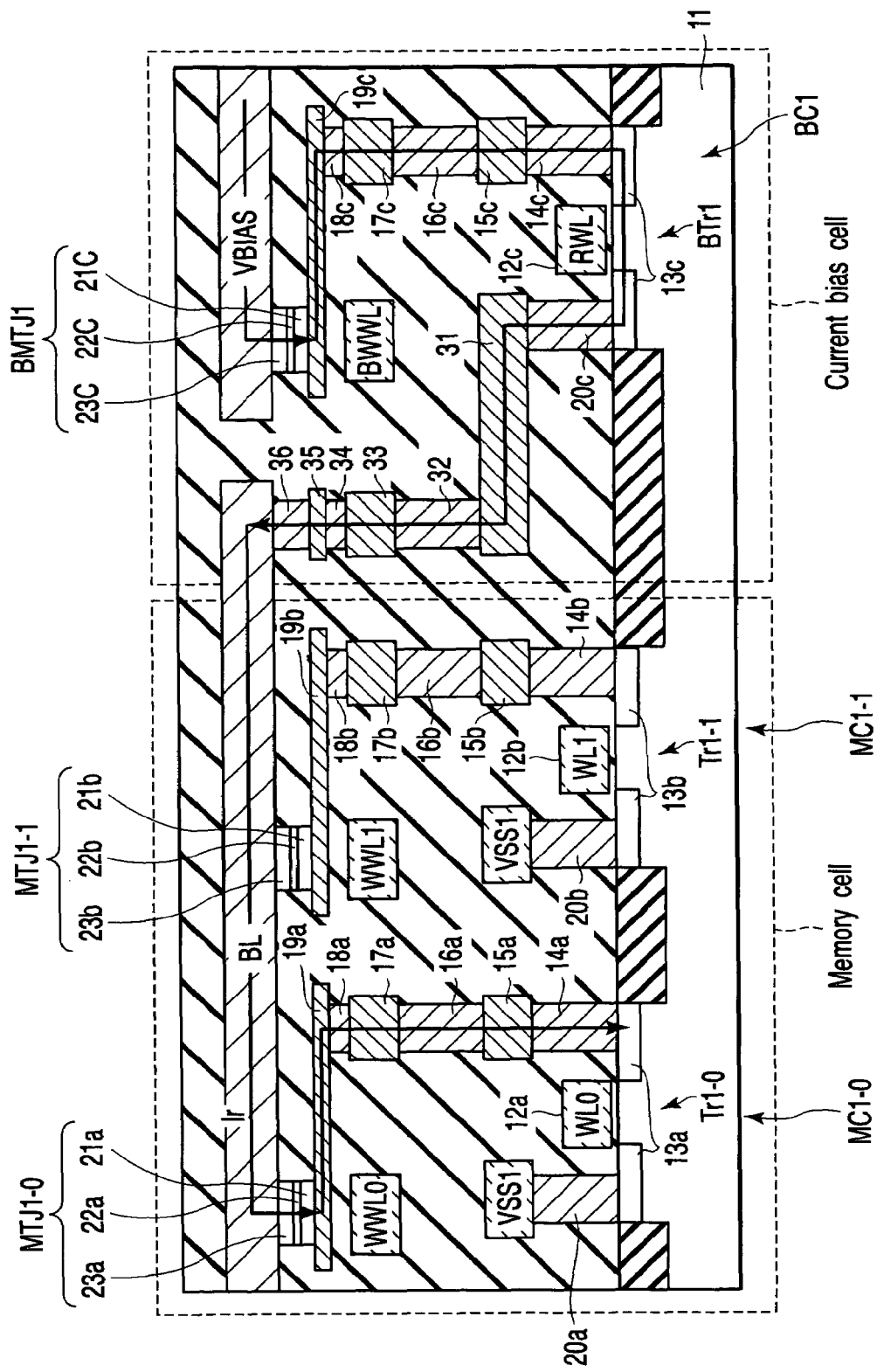
F I G. 4

MAGNETIC RANDOM ACCESS MEMORY

CROSS-REFERENCE TO RELATED APPLICATIONS

This application is based upon and claims the benefit of priority from prior Japanese Patent Application No. 2005-166950, filed Jun. 7, 2005, the entire contents of which are incorporated herein by reference.

BACKGROUND OF THE INVENTION

1. Field of the Invention

The present invention relates to a magnetic random access memory (MRAM) using, as a memory cell, a structure which reads out "1" or "0" information by using a magnetoresistive effect.

2. Description of the Related Art

As an information memory element, a memory cell of a magnetic random access memory (MRAM) which uses a tunneling magnetoresistive effect (to be referred to as TMR hereinafter) is disclosed in, e.g., Roy Scheuerlein et al., "A 10 ns Read and Write Non-Volatile Memory Array Using a Magnetic Tunnel Junction and FET Switch in each Cell", ISSCC 2000 Technical Digest, p. 128.

In a magnetic tunnel junction (MTJ) element with TMR, an insulating film is sandwiched between two magnetic thin films. The MTJ element has two states, i.e., a state wherein the magnetized directions of the upper and lower magnetic materials are parallel and a state in which the magnetized directions are anti-parallel.

When the magnetized directions of the upper and lower magnetic materials are parallel to each other, the tunnel resistance by the electric current flowing through the thin insulating film sandwiched between the magnetic materials is lowest. In this state, for example, it is recognized that "1" is stored by the read-out current. On the other hand, when the magnetized directions of the upper and lower magnetic materials are anti-parallel to each other, the tunnel resistance is highest. In this state, for example, it is recognized that "0" is stored by the read-out current.

In this example, 1-bit data is stored in two cells. That is, 1-bit data is stored in two MOS transistors+two MTJ elements as complementary values. In the read, a current is supplied from a current load to two cells, and the difference current is amplified. Data is determined depending on which read current is larger in the two cells.

In the above example, no specific current load circuit form is presented. In, e.g., Peter K. Naji, et al., "A 256 kb 3.0V 1T1MTJ Nonvolatile Magnetoresistive RAM", ISSCC 2001 Technical Digest, p. 122, FIGS. 7.6.4., a MOS circuit is used as a current conveyor as an example of the current load. As a memory to read the magnitude of a current, for example, a flash memory is used. Even in this case, a MOS circuit is used as the current load.

The ratio of the resistance value of the current load to the resistance of an MTJ element, which increases the signal difference, will be examined.

FIG. 9 is a schematic view of a magnetic random access memory according to a prior art. As shown in FIG. 9, let R be the resistance of an MTJ element, m be the MR ratio, L be the resistance value of the current load, and I be the bias current of the current load. The input voltage of the sense amplifier equals the divided voltage of the resistance R of the MTJ element and the resistance L of the current load. Assume that complementary data are written in two cells according to Roy Scheuerlein et al. Parasitic resistances existed in the read-out current paths make the difference voltage between the two cells decrease. Hence, the resistance of a select MOS transistor is designed to be negligible with respect to the resistance R of the MTJ element. Then, a difference voltage Vs between the two cells is given by $$Vs = I \times [R \cdot (1+m)/\{L+R \cdot (1+m)\} - R/(L+R)] \quad (1)$$

In equation (1), $L/R = r$ is set, and $dVs/dr$ is calculated to obtain the maximum value of Vs. Consequently, we obtain $$Vs = I \times m \times r / \{(1+r) \times (1+m+r)\} \quad (2)$$

$$dVs/dr = I \times m \times (1+m-r^2) / \{(1+r)^2 \times (1+m+r)^2\} \quad (3)$$

Since m and r are positive, Vs takes the maximum value when $r = \sqrt{(1+m)}$. In an MTJ element using a metal ferromagnetic material, m is about 0.2 to 0.4. For this reason, r is about 1. That is, the resistance value L of the current load preferably almost equals the resistance R of the MTJ element.

As can be estimated easily, no signal difference is generated when the resistance of the MOS transistor serving as the current load for the two cells shifts by about m. To avoid any manufacturing variation, the channel length and channel width of the MOS transistor are set to be relatively large. In addition, a plurality of MOS transistors are used in parallel. Hence, the layout area of the current load circuit becomes large.

The manufacturing step of the MTJ element and that of the MOS transistor are different. For this reason, the manufacturing variation can be regarded as an independent event. More specifically, the channel width of the MOS transistor is determined in the step of forming an active area on the surface of a silicon substrate. The channel width is determined in the step of forming a gate electrode. Important steps to determine the characteristic of the MOS transistor also include a step of forming a gate insulating film and a step of doping a channel impurity. Important steps to determine the resistance value of the MTJ element include a step of forming the tunnel insulating film of the MTJ element and a step of separating MTJ elements for respective cells. That is, the manufacturing variation of the resistance value of the MTJ element and that of the resistance value of the MOS transistor have no relevance. Hence, the ratio of the resistance value of the MTJ element to that of the MOS transistor may greatly deviate from 1 without careful manufacturing.

As described above, in the prior art, it is difficult to make the resistance value of the MTJ element almost equal to that of the MOS transistor, resulting in adverse effect on the read characteristic.

BRIEF SUMMARY OF THE INVENTION

A magnetic random access memory according to an aspect of the present invention comprises a first magnetoresistive element which is used as a memory element, and a second magnetoresistive element which is used as a current load of a read bias circuit.

BRIEF DESCRIPTION OF THE SEVERAL VIEWS OF THE DRAWING

FIG. 1 is a schematic circuit diagram showing a magnetic random access memory according to the first embodiment of the present invention;

FIG. 4 is a schematic sectional view showing another magnetic random access memory according to the first embodiment of the present invention;

DETAILED DESCRIPTION OF THE INVENTION

Figure 2:
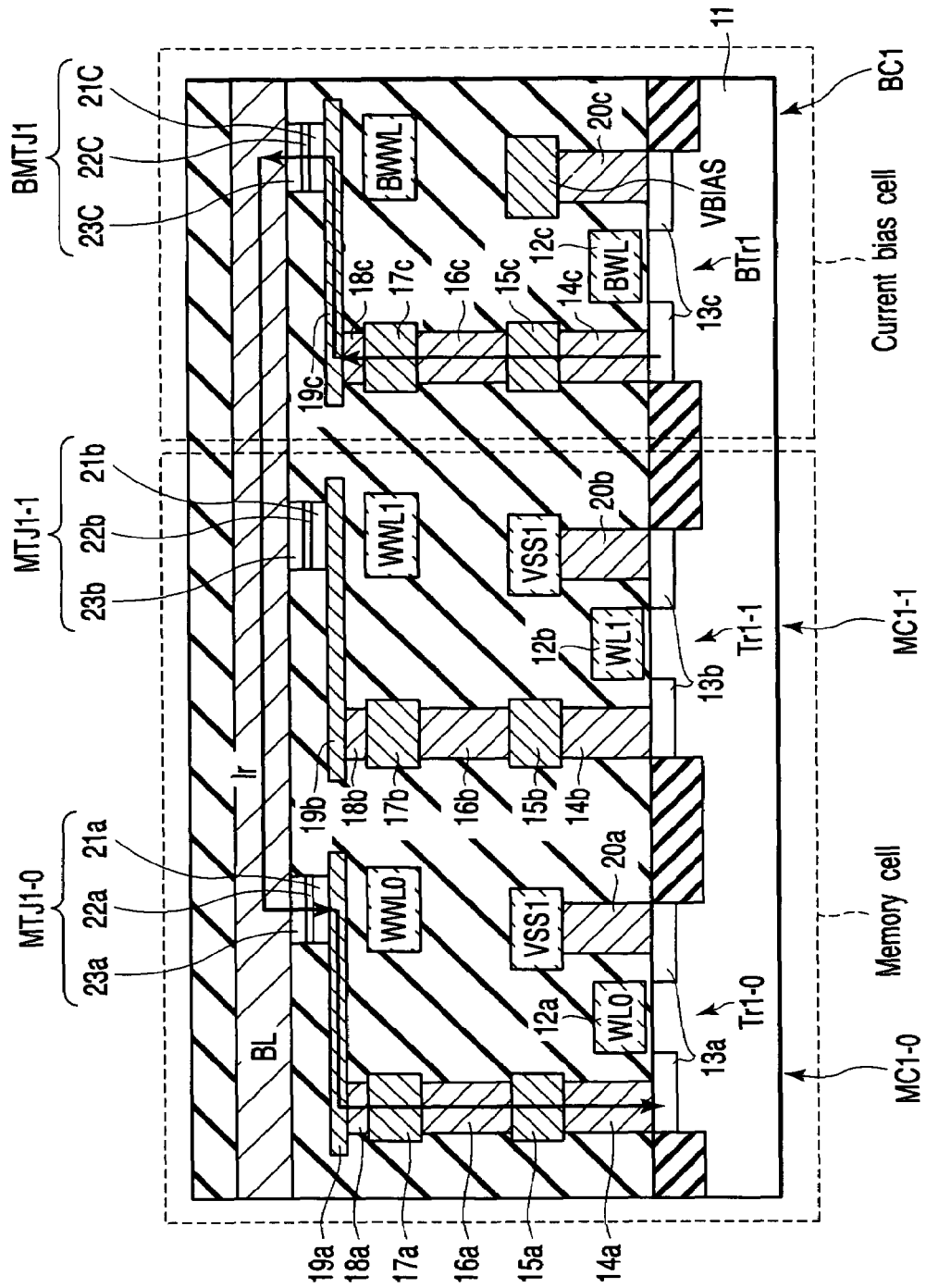
FIG. 2 is a schematic sectional view showing the magnetic random access memory according to the first embodiment of the present invention.

The embodiments of the present invention will be described below with reference to the accompanying drawing. The same reference numerals denote the same parts throughout the drawing.

First Embodiment

In the first embodiment, 1-bit data is stored in two cells.

FIG. 1 is a schematic circuit diagram showing a magnetic random access memory according to the first embodiment of the present invention. The circuit arrangement of the magnetic random access memory according to the first embodiment will be described below.

As shown in FIG. 1, in the magnetic random access memory according to the first embodiment, a plurality of memory cells MC0-0, MC1-0, MC0-1, and MC1-1 are arranged in a matrix to form a memory cell array MCA.

The memory cells MC0-0, MC1-0, MC0-1, and MC1-1 have magnetic tunnel junction (MTJ) elements MTJ0-0, MTJ1-0, MTJ0-1, and MTJ1-1 used as memory elements, and MOS transistors Tr0-0, Tr1-0, Tr0-1, and Tr1-1 functioning as read switching elements, respectively.

One terminal of each of the MTJ elements MTJ1-0 and MTJ1-1 is connected to a common bit line BL. One terminal of each of the MTJ elements MTJ0-0 and MTJ0-1 is connected to a common bit line /BL. A sense amplifier S/A is connected to the bit lines BL and /BL. When a dynamic latch used in, e.g., a DRAM is used as the sense amplifier S/A, the structure can be made compact.

The other terminal of the MTJ element MTJ0-0 is connected to one end of the current path of the MOS transistor Tr0-0. The other terminal of the MTJ element MTJ1-0 is connected to one end of the current path of the MOS transistor Tr1-0. The other terminal of the MTJ element MTJ0-1 is connected to one end of the current path of the MOS transistor Tr0-1. The other terminal of the MTJ element MTJ1-1 is connected to one end of the current path of the MOS transistor Tr1-1.

The other end of each of the current paths of the MOS transistors Tr1-0 and Tr1-1 is connected to a common ground terminal VSS1 to supply a ground potential. The other end of each of the current paths of the MOS transistors Tr0-0 and Tr0-1 is connected to a common ground terminal VSS0 to supply a ground potential.

The gates of the MOS transistors Tr0-0 and Tr0-1 are connected to a common read word line WL0. The gates of the MOS transistors Tr0-1 and Tr1-1 are connected to a common read word line WL1.

In the first embodiment, 1-bit data is stored by using two cells. That is, the memory cells MC0-0 and MC1-0 are paired so that "0" data is stored in the MTJ element MTJ0-0, and "1" data as complementary data of the MTJ element MTJ0-0 is stored in the MTJ element MTJ1-0. Similarly, the memory cells MC0-1 and MC1-1 are paired so that "0" data is stored in the MTJ element MTJ0-1, and "1" data as complementary data of the MTJ element MTJ0-1 is stored in the MTJ element MTJ1-1.

In the memory cell array MCA, current bias cells BC0 and BC1 having the same structure as the memory cells MC0-0, MC1-0, MC0-1, and MC1-1 are arranged as current bias circuits.

The current bias cells BC0 and BC1 have MTJ elements BMTJ0 and BMTJ1 used as current loads in the read and MOS transistors BTr0 and BTr1 functioning as read switching elements, respectively.

One terminal of the MTJ element BMTJ1 is connected to the bit line BL. The other terminal of the MTJ element BMTJ1 is connected to one end of the current path of the MOS transistor BTr1. One terminal of the MTJ element BMTJ0 is connected to the bit line /BL. The other terminal of the MTJ element BMTJ0 is connected to one end of the current path of the MOS transistor BTr0. A common bias terminal VBIAS to supply a bias potential generated in the device is connected to the other end of each of the current paths of the MOS transistors BTr0 and BTr1. A common word line BWL is connected to the gates of the MOS transistors BTr0 and BTr1.

It is only necessary that a difference is present between the potential supplied to the other end of each of the current paths of the MOS transistors BTr0 and BTr1 and the potential supplied to the other end of each of the current paths of the MOS transistors Tr1-0, Tr1-1, Tr0-0, and Tr0-0. Hence, a power supply terminal to supply a power supply potential may be connected to the other end of each of the current paths of the MOS transistors BTr0 and BTr1. Alternatively, a ground terminal to supply a ground potential may be connected to the other end of each of the current paths of the MOS transistors BTr0 and BTr1, and a bias terminal to supply a bias potential or a power supply terminal to supply a power supply potential may be connected to the other end of each of the current paths of the MOS transistors Tr1-0, Tr1-1, Tr0-0, and Tr0-0.

FIG. 2 is a schematic sectional view of the magnetic random access memory according to the first embodiment of the present invention. FIG. 2 shows an example of the sectional structure of the memory cells MC1-0 and MC1-1 and the current bias cell BC1 shown in FIG. 1.

As shown in FIG. 2, the memory cells MC1-0 and MC1-1 and current bias cell BC1 are formed on a single semiconductor substrate 11. Gate electrodes 12a, 12b, and 12c are formed on the semiconductor substrate 11. Source and drain diffusion layers 13a, 13b, and 13c are formed in the semiconductor substrate 11 on both sides of the gate electrodes 12a, 12b, and 12c, respectively, so that the MOS transistors Tr1-0, Tr1-1, and BTr1 are formed. The gate electrodes 12a, 12b, and 12c function as the read word lines WL0, WL1, and BWL, respectively.

In the memory cell MC1-0, one of the source and drain diffusion layers 13a is connected to one terminal of the MTJ element MTJ1-0 through contacts 14a, 16a, and 18a and interconnections 15a, 17a, and 19a. The other terminal of the MTJ element MTJ1-0 is connected to the bit line BL. The other of the source and drain diffusion layers 13a is connected to the ground terminal VSS1 through a contact 20a. A write word line WWL0 is arranged under the MTJ element MTJ1-0 while being spaced apart from it.

In the memory cell MC1-1, one of the source and drain diffusion layers 13b is connected to one terminal of the MTJ element MTJ1-1 through contacts 14b, 16b, and 18b and interconnections 15b, 17b, and 19b. The other terminal of the MTJ element MTJ1-1 is connected to the bit line BL. The other of the source and drain diffusion layers 13b is connected to the ground terminal VSS1 through a contact 20b. A write word line WWL1 is arranged under the MTJ element MTJ1-1 while being spaced apart from it.

In the current bias cell BC1, one of the source and drain diffusion layers 13c is connected to one terminal of the MTJ element BMTJ1 through contacts 14c, 16c, and 18c and interconnections 15c, 17c, and 19c. The other terminal of the MTJ element BMTJ1 is connected to the bit line BL. The other of the source and drain diffusion layers 13c is connected to the bias terminal VBIAS through a contact 20c. A word line BWWL is arranged under the MTJ element BMTJ1 while being spaced apart from it.

In the memory cells MC1-0 and MC1-1 and current bias cell BC1, the MTJ elements MTJ1-0, MTJ1-1, and BMTJ1 include fixed layers 21a, 21b, and 21c whose magnetizations are fixed, recording layers 23a, 23b, and 23c whose magnetizations are inverted, and nonmagnetic layers (e.g., tunnel barrier layers) 22a, 22b, and 22c sandwiched between the fixed layers 21a, 21b, and 21c and the recording layers 23a, 23b, and 23c, respectively.

The resistance value of the MTJ element BMTJ1 used as a current load preferably equals the resistance value of the MTJ elements MTJ1-0 and MTJ1-1. In other words, the resistances preferably almost equal when the relative relationship in magnetization direction between the recording layer and the fixed layer of the MTJ element BMTJ1 used as a current load is the same as the relative relationship in magnetization direction between the recording layers and the fixed layers of the MTJ elements MTJ1-0 and MTJ1-1. In addition, the MTJ elements BMTJ1, MTJ1-0, and MTJ1-1 preferably have almost the same shape and structure. They are preferably formed by using, e.g., the same material, same planar shape, same thickness, and same film structure.

The MOS transistors BTr0 and BTr1 and MOS transistors Tr1-0, Tr1-1, Tr0-0, and Tr0-1 serving as switching elements preferably have almost the same shape and structure.

In FIG. 2, the fixed layers 21a, 21b, and 21c are connected to the interconnections 19a, 19b, and 19c, respectively. The recording layers 23a, 23b, and 23c are connected to the bit line BL. The vertical positional relationship between the fixed layers 21a, 21b, and 21c and recording layers 23a, 23b, and 23c may be reversed.

The read operation of the magnetic random access memory according to the first embodiment will be described next. An example will be described here in which the data of the memory cells MC1-0 and MC0-0 in FIG. 1 are read out.

As shown in FIG. 1, the word lines WL0 and BWL are selected. The MOS transistors Tr1-0, Tr0-0, BTr1, and BTr0 are turned on to supply a read current Ir from the bias terminal VBIAS to the ground terminal VSS1 and a read current Ir' from the bias terminal VBIAS to the ground terminal VSS0. More specifically, the read current Ir flows through the bias terminal VBIAS→MOS transistor BTr1→MTJ element BMTJ1→bit line BL→MTJ element MTJ1-0→MOS transistor Tr1-0→ground terminal VSS1. The read current Ir' flows through the bias terminal VBIAS→MOS transistor BTr0→MTJ element BMTJ0→bit line /BL→MTJ element MTJ0-0→MOS transistor Tr0-0→ground terminal VSS0.

The read currents Ir and Ir' are supplied from the current load to the two memory cells MC1-0 and MC0-0, respectively. The data is determined depending on which of the voltages generated on bit lines BL0 and BL1 is larger. More specifically, the potential difference between the ground potential and the bias potential is defined as Vb. The resistance is defined as R0 assuming that "0" is written in the MTJ elements BMTJ0, BMTJ1, and MTJ1-0. The resistance is defined as R1 assuming that "1" is written in the MTJ element MTJ0-0. When the resistance of the MOS transistor can be neglected with respect to the resistance of the MTJ element, $Ir=Vb/(R0+R0)$, and $Ir'=Vb/(R0+R1)$. Hence, the potential of the bit line BL is $Ir \times R0=Vb/2$, and the potential of the bit line /BL is $Ir' \times R1=Vb/(1+R0/R1)$. The potential differences are compared.

Focus will be placed on the current path of the read current Ir. One end of the bit line BL commonly used by the memory cell MC1-0 and current bias cell BC1 is connected to the bias terminal VBIAS to which the bias potential is supplied. The other end of the bit line BL is connected to the ground terminal VSS1 to which the ground potential is supplied. Hence, in the read operation, different potentials are supplied to one end and the other end of the current path of the current Ir which flows to the common bit line BL.

Similarly, focus will be placed on the current path of the read current Ir'. One end of the bit line /BL commonly used by the memory cell MC0-0 and current bias cell BC0 is connected to the bias terminal VBIAS to which the bias potential is supplied. The other end of the bit line /BL is connected to the ground terminal VSS0 to which the ground potential is supplied. Hence, in the read operation, different potentials are supplied to one end and the other end of the current path of the current Ir' which flows to the common bit line /BL.

As shown in FIG. 2, in the MTJ element BMTJ1, the read current Ir flows from the fixed layer 21c to the recording layer 23c. In the MTJ element MTJ1-0, the read current Ir flows from the recording layer 23a to the fixed layer 21a. For this reason, the read current Ir to the MTJ elements MTJ1-0 and BMTJ1 connected to the same bit line BL flows in reverse directions.

According to the first embodiment, a cell having the same structure as a memory cell is directly used as a current bias cell. Since MTJ elements having the same structure are used in the memory cell and current bias cell, manufacturing variations are generated in the same direction. That is, if the resistance value of the memory cell shifts in the increasing direction, the resistance value of the current load also shifts in the increasing direction. Conversely, MTJ elements which exhibit the same behavior for variations can be evaluated as cells with the same structure.

The manufacturing variation hardly influences the characteristic as compared to a conventional structure in which the resistance of a current load formed from a normal MOS transistor is made to equal that of an MTJ element. For this reason, any degradation in read characteristic due to the manufacturing variation can be suppressed.

Figure 3:
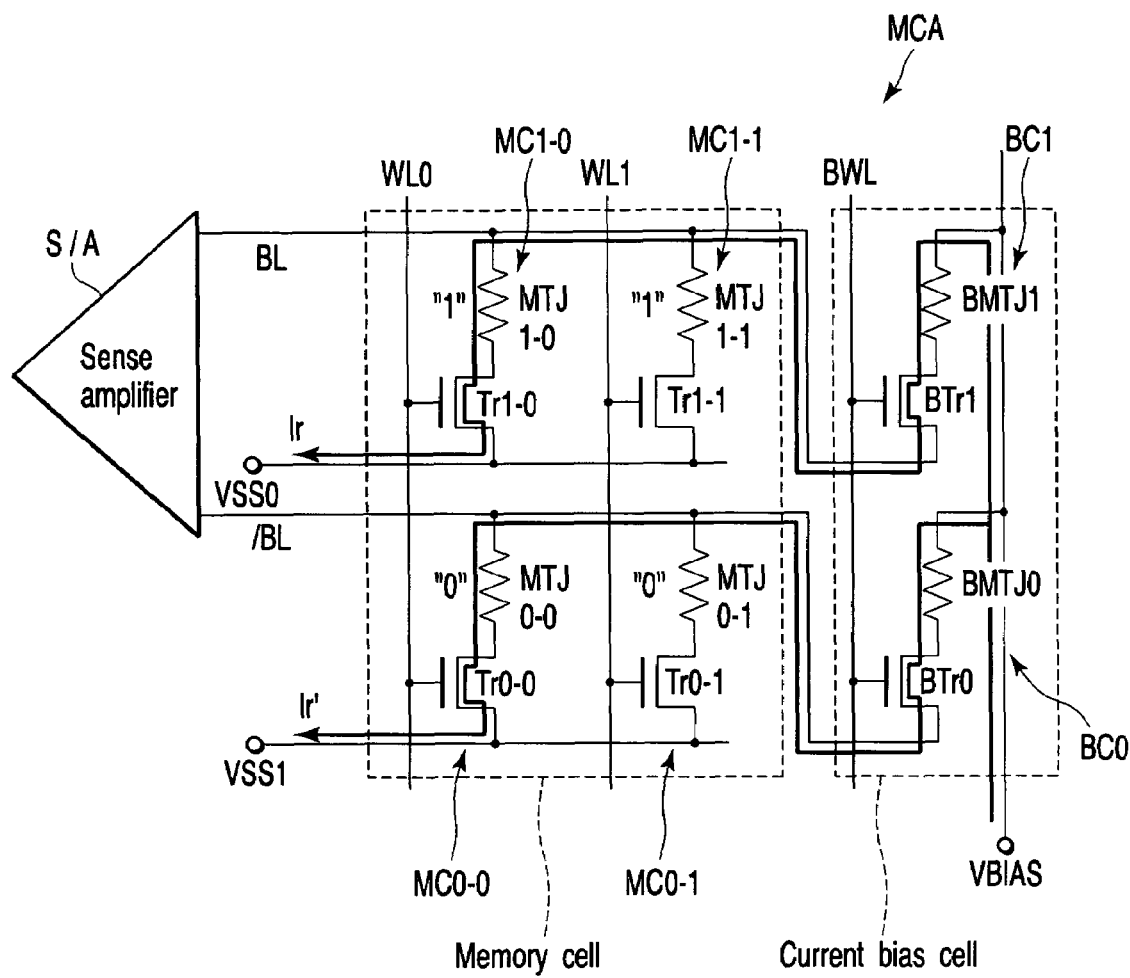
FIG. 3 is a schematic circuit diagram showing another magnetic random access memory according to the first embodiment of the present invention.

In the read operation, the read current Ir to the MTJ element in a memory cell and the MTJ element in a current bias cell, which are connected to the same bit line, may be supplied in the same direction. For example, as shown in FIGS. 3 and 4, one end of each of the current paths of the MOS transistors BTr1 and BTr0 of the current bias cells BC1 and BC0 is connected to a corresponding one of the bit line BL and /BL. One terminal of each of the MTJ elements BMTJ1 and BMTJ0 is connected to the bias terminal VBIAS. When the data of, e.g., the memory cell MC1-0 is to be read out, the read current Ir flows from the recording layer 23c to the fixed layer 21c in the MTJ element BMTJ1. Even in the MTJ element MTJ1-0, the read current Ir flows from the recording layer 23a to the fixed layer 21a, as shown in FIG. 4. Hence, the read current Ir flows to the MTJ elements BMTJ1 and MTJ1-0 in the same direction.

Figure 5:
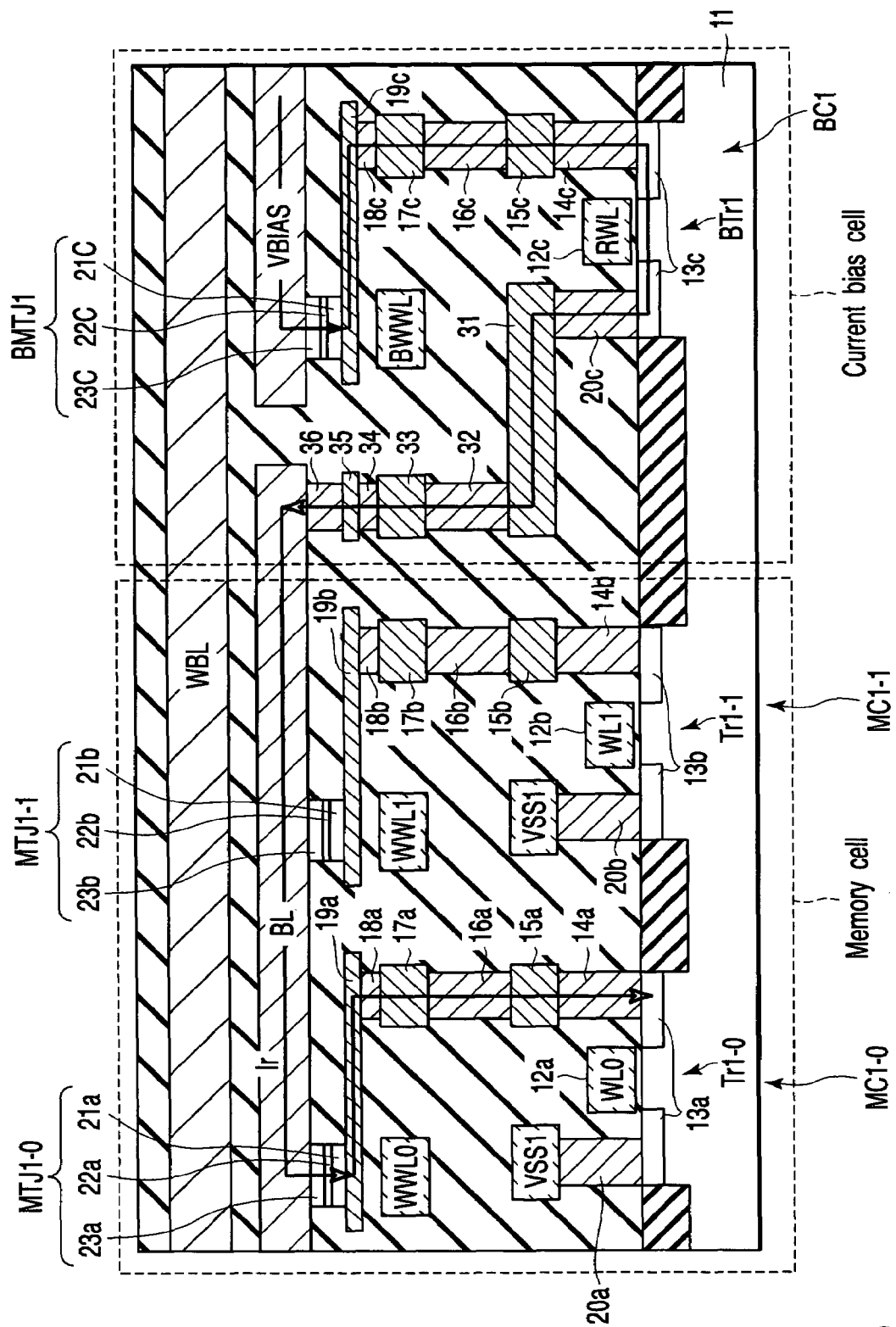
FIG. 5 is a schematic sectional view showing the magnetic random access memory of FIG. 4 with a write bit line.

In the example shown in FIGS. 3 and 4, no bit line BL runs near the MTJ elements BMTJ1 and BMTJ0 of the current bias cells BC1 and BC0. Hence, for example, a write bit line WBL may be provided near the MTJ elements BMTJ1, MTJ1-0, and MTJ1-1 above the MTJ elements BMTJ1, MTJ1-0, and MTJ1-1, as shown in FIG. 5. In this case, a magnetic field write can be executed even in the MTJ element BMTJ1 by using the bit line WBL and word line BWWL.

Second Embodiment

In the second embodiment, a reference cell is used.

Figure 6:
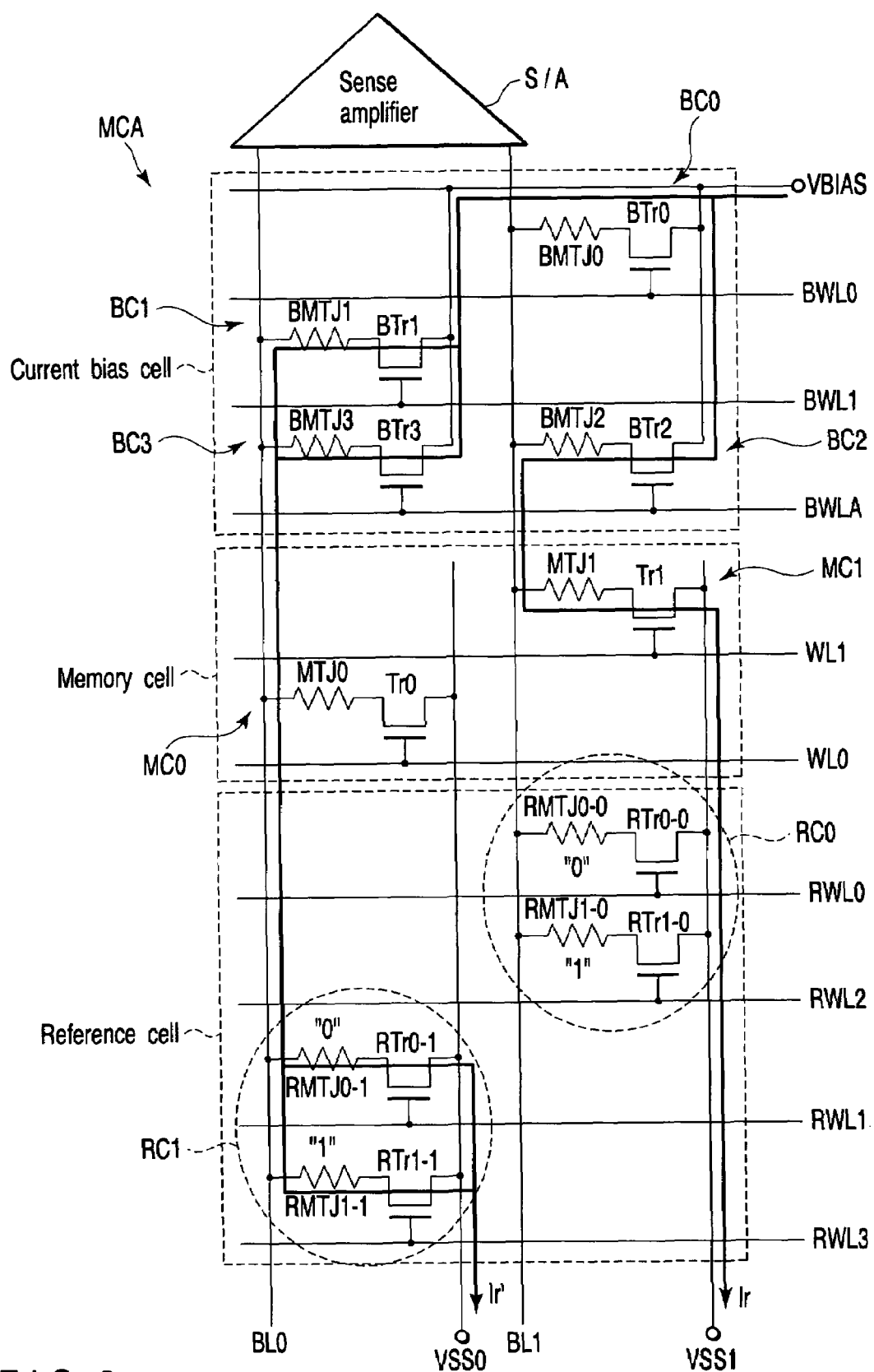
FIG. 6 is a schematic circuit diagram showing a magnetic random access memory according to the second embodiment of the present invention.

FIG. 6 is a schematic circuit diagram of a magnetic random access memory according to the second embodiment of the present invention. The circuit arrangement of the magnetic random access memory according to the second embodiment will be described below.

As shown in FIG. 6, in the magnetic random access memory according to the second embodiment, reference cells RC0 and RC1 each including a pair of cells, i.e., one cell in which "1" is written and the other cell in which "0" is written, are prepared to generate a reference potential. In a memory cell array MCA, memory cells MC0 and MC1, current bias cells BC0, BC1, BC2, and BC3, and the reference cells RC0 and RC1 are arranged.

The memory cell MC0 has an MTJ element MTJ0 and a MOS transistor Tr0. One terminal of the MTJ element MTJ0 is connected to a bit line BL0. The other terminal of the MTJ element MTJ0 is connected to one end of the current path of the MOS transistor Tr0. The other end of the current path of the MOS transistor Tr0 is connected to a ground terminal VSS0. The gate electrode of the MOS transistor Tr0 is connected to a read word line WL0.

The memory cell MC1 has an MTJ element MTJ1 and a MOS transistor Tr1. One terminal of the MTJ element MTJ1 is connected to a bit line BL1. The other terminal of the MTJ element MTJ1 is connected to one end of the current path of the MOS transistor Tr1. The other end of the current path of the MOS transistor Tr1 is connected to a ground terminal VSS1. The gate electrode of the MOS transistor Tr1 is connected to a read word line WL1.

The reference cell RC0 functions as a reference cell for the memory cell MC0. The reference cell RC0 has an MTJ element RMTJ0-0 in which "0" is recorded, and an MTJ element RMTJ1-0 in which "1" is recorded. One end of each of the current paths of MOS transistors RTr0-0 and RTr1-0 is connected to one terminal of a corresponding one of the MTJ elements RMTJ0-0 and RMTJ1-0. The other terminal of each of the MTJ elements RMTJ0-0 and RMTJ1-0 is connected to the common bit line BL1. The other end of each of the current paths of the MOS transistors RTr0-0 and RTr1-0 is connected to the ground terminal VSS1. The gates of the MOS transistors RTr0-0 and RTr1-0 are connected to read word lines RWL0 and RWL2.

The reference cell RC1 functions as a reference cell for the memory cell MC1. The reference cell RC1 has an MTJ element RMTJ0-1 in which "0" is recorded, and an MTJ element RMTJ1-1 in which "1" is recorded. One end of each of the current paths of MOS transistors RTr0-1 and RTr1-1 is connected to one terminal of a corresponding one of the MTJ elements RMTJ0-1 and RMTJ1-1. The other terminal of each of the MTJ elements RMTJ0-1 and RMTJ1-1 is connected to the common bit line BL0. The other end of each of the current paths of the MOS transistors RTr0-1 and RTr1-1 is connected to the ground terminal VSS0. The gates of the MOS transistors RTr0-1 and RTr1-1 are connected to read word lines RWL1 and RWL3.

The current bias cells BC0, BC1, BC2, and BC3 have MTJ elements BMTJ0, BMTJ1, BMTJ2, and BMTJ3 used as current loads in the read and MOS transistors BTr0, BTr1, BTr2, and BTr3 functioning as read switching elements, respectively.

One terminal of each of the MTJ elements BMTJ1 and BMTJ3 is connected to the common bit line BL0. The other terminal of each of the MTJ elements BMTJ1 and BMTJ3 is connected to one end of a corresponding one of the current paths of the MOS transistors BTr1 and BTr3. One terminal of each of the MTJ elements BMTJ0 and BMTJ2 is connected to the common bit line BL1. The other terminal of each of the MTJ elements BMTJ0 and BMTJ2 is connected to one end of a corresponding one of the current paths of the MOS transistors BTr0 and BTr2.

A bias terminal VBIAS to supply a bias potential generated in the device is connected to the other end of each of the current paths of the MOS transistors BTr0, BTr1, BTr2, and BTr3. A word line BWL0 is connected to the gate of the MOS transistor BTr0. A word line BWL1 is connected to the gate of the MOS transistor BTr1. A common word line BWLA is connected to the gates of the MOS transistors BTr2 and BTr3.

The current bias cell BC3 functions as a bias cell for the memory cell MC0. The current bias cell BC2 functions as a bias cell for the memory cell MC1. The current bias cells BC1 and BC3 function as bias cells for the reference cell RC1. The current bias cells BC0 and BC2 function as bias cells for the reference cell RC0.

It is only necessary that a difference is present between the potential supplied to the other end of each of the current paths of the MOS transistors BTr0 and BTr2 and the potential supplied to the other end of each of the current paths of the MOS transistors Tr1, RTr0-0, and RTr1-0. Hence, a power supply terminal to supply a power supply potential may be connected to the other end of each of the current paths of the MOS transistors BTr0 and BTr2. Alternatively, a ground terminal to supply a ground potential may be connected to the other end of each of the current paths of the MOS transistors BTr0 and BTr2, and a bias terminal to supply a bias potential or a power supply terminal to supply a power supply potential may be connected to the other end of each of the current paths of the MOS transistors Tr1, RTr0-0, and RTr1-0.

Similarly, it is only necessary that a difference is present between the potential supplied to the other end of each of the current paths of the MOS transistors BTr1 and BTr3 and the potential supplied to the other end of each of the current paths of the MOS transistors Tr0, RTr0-1, and RTr1-1. Hence, a power supply terminal to supply a power supply potential may be connected to the other end of each of the current paths of the MOS transistors BTr1 and BTr3. Alternatively, a ground terminal to supply a ground potential may be connected to the other end of each of the current paths of the MOS transistors BTr1 and BTr3, and a bias terminal to supply a bias potential or a power supply terminal to supply a power supply potential may be connected to the other end of each of the current paths of the MOS transistors Tr0, RTr0-1, and RTr1-1.

The resistance value of the MTJ elements BMTJ0, BMTJ1, BMTJ2, and BMTJ3 used as current loads preferably equals the resistance value of the MTJ elements MTJ0, MTJ1, RMTJ0-0, RMTJ1-0, RMTJ0-1, and RMTJ1-1. In other words, the resistances preferably almost equal when the relative relationship in magnetization direction between the recording layer and the fixed layer of the MTJ elements BMTJ0, BMTJ1, BMTJ2, and BMTJ3 used as current loads is the same as the relative relationship in magnetization direction between the recording layers and the fixed layers of the MTJ elements MTJ0, MTJ1, RMTJ0-0, RMTJ1-0, RMTJ0-1, and RMTJ1-1. In addition, the MTJ elements BMTJ0, BMTJ1, BMTJ2, BMTJ3, MTJ0, MTJ1, RMTJ0-0, RMTJ1-0, RMTJ0-1, and RMTJ1-1 preferably have almost the same shape and structure. They are preferably formed by using, e.g., the same material, same planar shape, same thickness, and same film structure.

The MOS transistors BTr0, BTr1, BTr2, and BTr3 and MOS transistors Tr0, Tr1, RTr0-0, RTr1-0, RTr0-1, and RTr1-1 serving as switching elements preferably have almost the same shape and structure.

The sectional structure of the magnetic random access memory according to the second embodiment is almost the same as in the first embodiment shown in FIG. 2. The reference cell has the same sectional structure as that of the memory cell.

Figure 7:
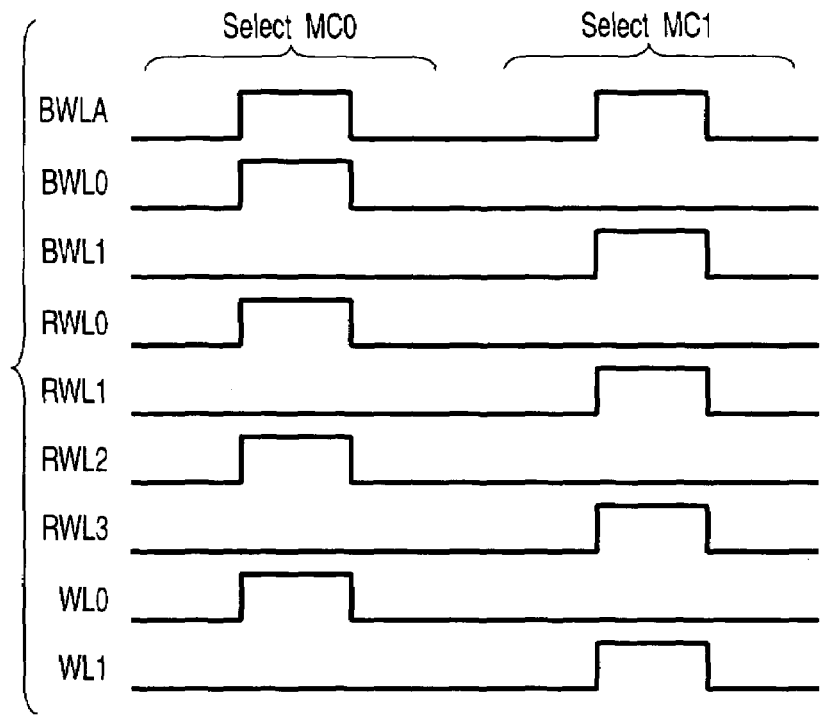
FIG. 7 is a timing chart of the read operation of the magnetic random access memory according to the second embodiment of the present invention.
Figure 9:
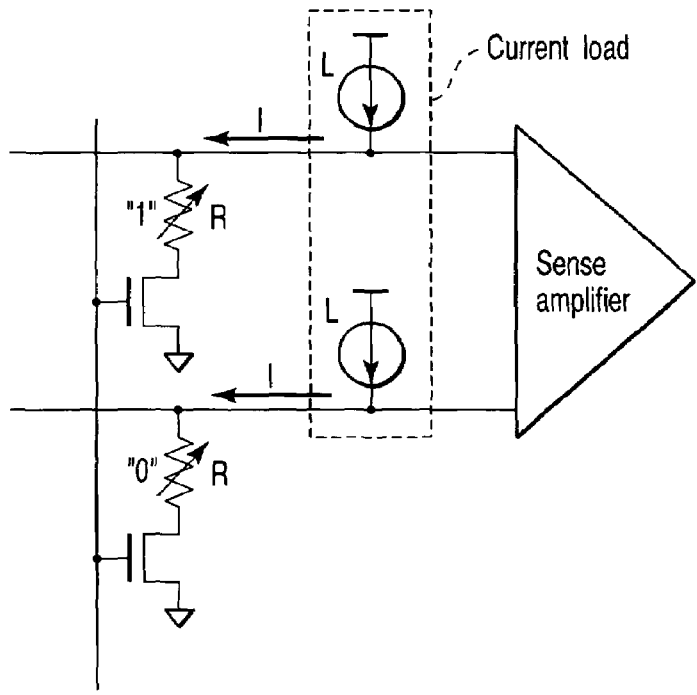
FIG. 9 is a schematic view showing a magnetic random access memory according to a prior art.

FIG. 7 is a timing chart of the read operation of the magnetic random access memory according to the second embodiment. The read operation according to the second embodiment will be described below. An example will be described here in which the data of the memory cell MC1 in FIG. 6 is read out.

As shown in FIG. 6, the current path of the reference cell RC1 connected to the bit line BL0 paired with the bit line BL1 is opened to a sense amplifier S/A connected to the bit line BL1 connected to the memory cell MC1 as a selected cell. On the other hand, as a current bias circuit, the current path of one current bias cell BC2 is opened to the bit line BL1 of the memory cell MC1. In addition, the current paths of two current bias cells BC1 and BC3 are opened to the bit line BL0 of the reference cell RC1.

More specifically, the word lines WL1, RWL1, RWL3, BWL1, and BWLA are selected (FIG. 7). The MOS transistors Tr1, RTr0-1, RTr1-1, BTr1, BTr2, and BTr3 are turned on to supply a read current Ir from the bias terminal VBIAS to the ground terminal VSS1 and a read current Ir' from the bias terminal VBIAS to the ground terminal VSS0.

More specifically, the read current Ir flows through the bias terminal VBIAS→MOS transistor BTr2→MTJ element BMTJ2→bit line BL1→MTJ element MTJ1→MOS transistor Tr1→ground terminal VSS1. The read current Ir' flows through the bias terminal VBIAS→MOS transistors BTr1 and BTr3→MTJ elements BMTJ1 and BMTJ3→bit line BL0→MTJ elements RMTJ0-1 and RMTJ1-1→MOS transistors RTr0-1 and RTr1-1→ground terminal VSS0.

Focus will be placed on the current path of the read current Ir. One end of the bit line BL1 commonly used by the memory cell MC1 and current bias cell BC2 is connected to the bias terminal VBIAS to which the bias potential is supplied. The other end of the bit line BL1 is connected to the ground terminal VSS1 to which the ground potential is supplied. Hence, in the read operation, different potentials are supplied to one end and the other end of the current path of the current Ir which flows to the common bit line BL1.

Similarly, focus will be placed on the current path of the read current Ir'. One end of the bit line BL0 commonly used by the reference cell RC1 and current bias cells BC1 and BC3 is connected to the bias terminal VBIAS to which the bias potential is supplied. The other end of the bit line BL0 is connected to the ground terminal VSS0 to which the ground potential is supplied. Hence, in the read operation, different potentials are supplied to one end and the other end of the current path of the current Ir' which flows to the common bit line BL0.

The read current Ir to the MTJ elements MTJ1 and BMTJ2 connected to the same bit line BL1 flows in reverse directions. The read current Ir' to the MTJ elements RMTJ0-1 and RMTJ1-1 and the MTJ elements BMTJ1 and BMTJ3 connected to the same bit line BL0 flows in reverse directions.

According to the second embodiment, a cell having the same structure as a memory cell is directly used as a current bias cell. Hence, the same effect as in the first embodiment can be obtained. In the second embodiment, additionally, since a reference cell is used, the storage density can be increased as compared to the first embodiment.

Figure 8:
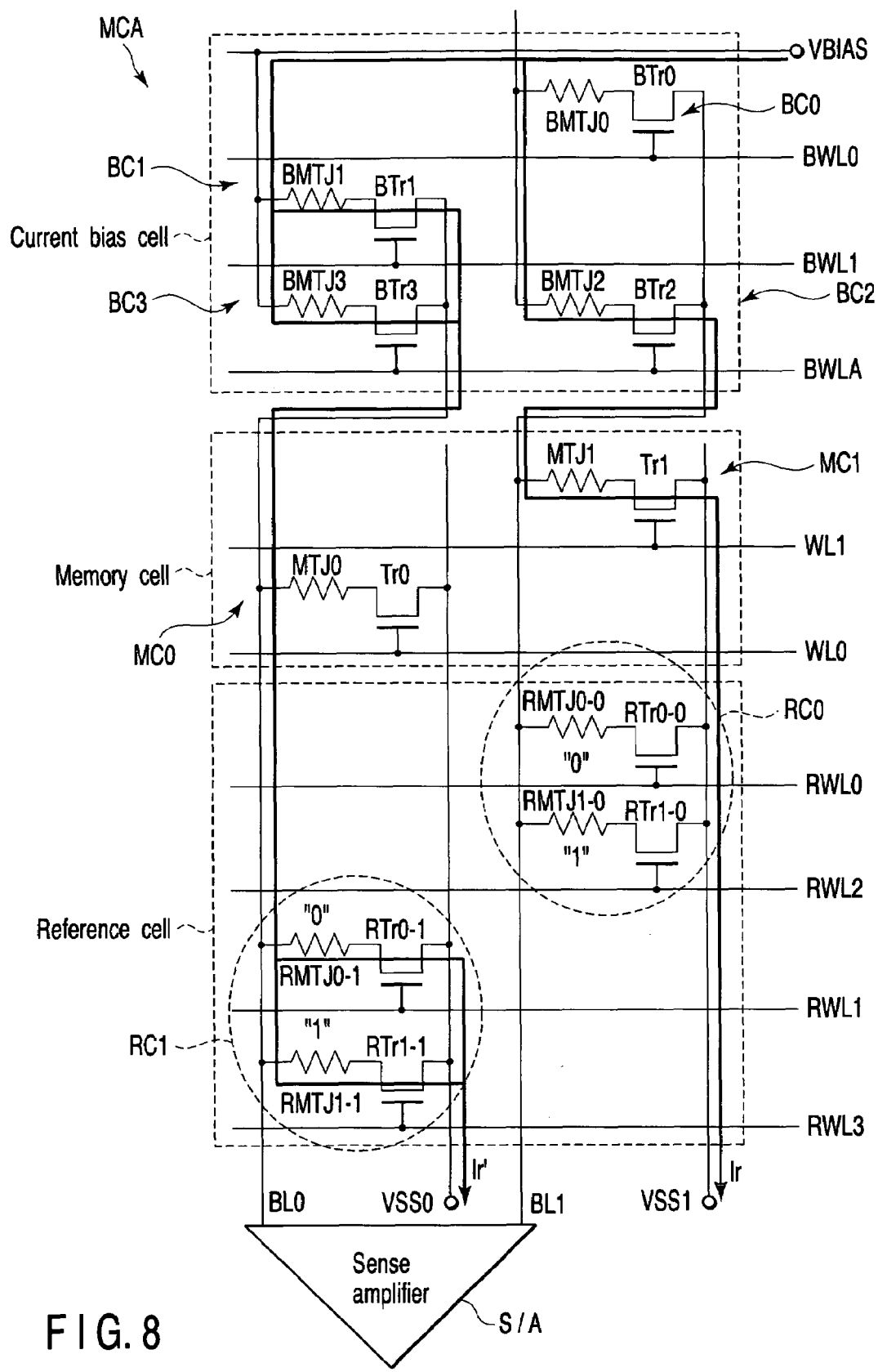
FIG. 8 is a schematic circuit diagram showing another magnetic random access memory according to the second embodiment of the present invention.

In the read operation, the read current Ir to the MTJ element in a memory cell and the MTJ element in a current bias cell, which are connected to the same bit line, may be supplied in the same direction. In addition, the read current Ir' to the MTJ element in a reference cell and the MTJ element in a current bias cell, which are connected to the same bit line, may be supplied in the same direction. For example, as shown in FIG. 8, one end of each of the current paths of the MOS transistors BTr0 and BTr2 of the current bias cells BC0 and BC2 is connected to the bit line BL1. One terminal of each of the MTJ elements BMTJ0 and BMTJ2 is connected to the bias terminal VBIAS. In addition, one end of each of the current paths of the MOS transistors BTr1 and BTr3 of the current bias cells BC1 and BC3 is connected to the bit line BL0. One terminal of each of the MTJ elements BMTJ1 and BMTJ3 is connected to the bias terminal VBIAS. When the data of, e.g., the memory cell MC1 is to be read out, the read current Ir flows to the MTJ elements BMTJ2 and MTJ1 connected to the same bit line BL1 in the same direction. The read current Ir' flows to the MTJ elements BMTJ1 and BMTJ3 and the MTJ elements RMTJ0-1 and RMTJ1-1 connected to the same bit line BL0 in the same direction.

In the example shown in FIG. 8, no bit lines BL0 and BL1 run near the MTJ elements BMTJ0, BMTJ1, BMTJ2, and BMTJ3 of the current bias cells BC0, BC1, BC2, and BC3. Hence, for example, a write bit line WBL may be provided near the MTJ elements above the MTJ elements so that the data of the MTJ element can be rewritten by using a magnetic field occurred due to a current of the bit line WBL (FIG. 5). In this case, a magnetic field write can be executed even in the MTJ elements BMTJ0, BMTJ1, BMTJ2, and BMTJ3 by using the bit line WBL.

In the magnetic random access memories according to the first and second embodiments, the write operation can be executed by using various methods such as a synthetic magnetic field write method, toggle write method, and spin injection write method.

The synthetic magnetic field write method is executed in the following way. To write data in the MTJ element MTJ1-0 of the memory cell MC1-0 in FIG. 2, the bit line BL and word line WWL0 corresponding to the MTJ element MTJ1-0 are selected. Write currents Iw1 and Iw2 are supplied to the bit line BL and word line WWL0. A synthetic magnetic field generated by the write currents Iw1 and Iw2 is applied to the MTJ element MTJ1-0. As a result, a parallel state in which the magnetizations of the fixed layer 21a and recording layer 23a are directed in the same direction or an anti-parallel state in which the magnetizations are directed in reverse directions is changed. Hence, the "1" or "0" data write is accomplished.

In the toggle write method, the timings to supply the write currents Iw1 and Iw2 are adjusted in the above-described current field write method to rotate the magnetization for the MTJ which has the synthetic anti-ferromagnetic structured recording layer. This method is executed in the following way. To write data in the MTJ element MTJ1-0 of the memory cell MC1-0 in FIG. 2, data written in the MTJ element MTJ1-0 is read out. If the written data in the MTJ element MTJ1-0 (the read-out data) is not equal to the write data (the input data), the write is executed in the following way. One of the write currents Iw1 and Iw2 of the bit line BL and word line WWL0 is supplied at an earlier timing than the other write current. Subsequently, the other write current is also supplied in addition to one write current. At first, one current is generated the synthetic magnetic moment vector from the anti-ferromagnetic structured recording layer. Subsequently, the synthetic magnetic field by adding the other current is rotated the synthetic magnetic moment vector and each of the magnetic moment vector of the ferromagnetic layer consists of the anti-ferromagnetic structured recording layer. To rotate the synthetic magnetic moment vector and each of the magnetic moment vector of the ferromagnetic layer consists of the anti-ferromagnetic structured recording layer, the first current is cut off. Finally the second current is cut off, the synthetic magnetic moment vector is disappeared and the rotation is accomplished. Each of the magnetic moment vector of the ferromagnetic layer consists of the anti-ferromagnetic structured recording layer is reversed.

When the toggle write method is used, the recording layer of the MTJ element must have a multilayered structure including a first ferromagnetic layer, a nonmagnetic layer, and a second ferromagnetic layer, and the first and second ferromagnetic layers are antiferromagnetically coupled. In addition, the direction of axis of easy magnetization of the MTJ element is preferably tilted about 30° to 60° (preferably 45°) with respect to the running direction of the write interconnection (bit line or word line).

In the spin injection write method, a write current is directly supplied in a direction perpendicular to the film surface of the MTJ element. This method is executed in the following way. Consider a case wherein data is to be written in the MTJ element MTJ1-0 of the memory cell MC1-0 in FIG. 2. To reverse the magnetization of the recording layer 23a from a parallel magnetization arrangement to an anti-parallel magnetization arrangement, electrons e are supplied from the recording layer 23a to the fixed layer 21a. In other words, a write current Iw is supplied from the fixed layer 21a to the recording layer 23a. To reverse the magnetization of the recording layer 23a from an anti-parallel magnetization arrangement to a parallel magnetization arrangement, the electrons e are supplied from the fixed layer 21a to the recording layer 23a. In other words, the write current Iw is supplied from the recording layer 23a to the fixed layer 21a.

The present invention is not limited to the above-described embodiments, and various changes and modifications can be made without departing from the spirit and scope of the present invention. For example, as a read switching element, a diode may be used in place of a MOS transistor. In this case, the diode is preferably arranged in consideration of the read current flowing direction. The MOS transistor serving as a read switching element can variously be changed to, e.g., a MIS transistor, MES transistor, junction transistor, or bipolar transistor. In the embodiments, the ground potential lines connected to the ground terminals VSS0 and VSS1 and the bias line connected to the bias terminal VBIAS are perpendicular to each other. Instead, the ground potential lines and bias line may be parallel.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory comprising:
    a plurality of first magnetoresistive elements which are used as memory elements;
    a second magnetoresistive element which is used as a current load of a read bias circuit;
    a first bit line that is commonly connected to one terminal of each of the first magnetoresistive elements and one terminal of the second magnetoresistive element, a number of the first magnetoresistive elements connected to the first bit line being larger than a number of the second magnetoresistive element connected to the first bit line;
    a third magnetoresistive element which is used as a reference element and in which first data is recorded;
    a fourth magnetoresistive element which is used as the reference element and in which second data is recorded;
    a fifth magnetoresistive element which is used as the current load of the read bias circuit;
    a sixth magnetoresistive element which is used as the current load of the read bias circuit;
    a second bit line which is commonly connected to one terminal of each of the third magnetoresistive element, the fourth magnetoresistive element, the fifth magnetoresistive element, and the sixth magnetoresistive element;
    a first terminal which is connected to the other terminal of each of the first magnetoresistive elements and to which a first potential is supplied;
    a second terminal which is connected to the other terminal of each of the second magnetoresistive element, the fifth magnetoresistive element, and the sixth magnetoresistive element and to which a second potential different from the first potential is supplied; and
    a third terminal which is connected to the other terminal of the third magnetoresistive element and the other terminal of the fourth magnetoresistive element and to which a third potential different from the second potential is supplied.

2. The memory according to claim 1, wherein one of the second potential and a set of the first potential and the third potential is a ground potential, and the other of the second potential and the set of the first potential and the third potential is one of a power supply potential and a bias potential.

3. The memory according to claim 1, further comprising:
    a plurality of first switching elements corresponding to the first magnetoresistive elements, each of first current paths of the first switching elements having one end connected to the other terminal of each of the first magnetoresistive elements and an other end connected to the first terminal, a second switching element having a second current path whose one end is connected to the other terminal of the second magnetoresistive element and whose other end is connected to the second terminal, a third switching element having a third current path whose one end is connected to the other terminal of the third magnetoresistive element and whose other end is connected to the third terminal, a fourth switching element having a fourth current path whose one end is connected to the other terminal of the fourth magnetoresistive element and whose other end is connected to the third terminal, a fifth switching element having a fifth current path whose one end is connected to the other terminal of the fifth magnetoresistive element and whose other end is connected to the second terminal, and a sixth switching element having a sixth current path whose one end is connected to the other terminal of the sixth magnetoresistive element and whose other end is connected to the second terminal.

4. The memory according to claim 3, wherein the first switching element, the second switching element, the third switching element, the fourth switching element, the fifth switching element, and the sixth switching element have the same shape and structure.

5. The memory according to claim 1, further comprising:

a plurality of first switching elements corresponding to the first magnetoresistive elements, each of first current paths of the first switching elements having one end connected to the other terminal of each of the first magnetoresistive elements and an other end connected to the first terminal, a second switching element having a second current path whose one end is connected to the one terminal of the second magnetoresistive element and whose other end is connected to the first bit line, a third switching element having a third current path whose one end is connected to the other terminal of the third magnetoresistive element and whose other end is connected to the third terminal, a fourth switching element having a fourth current path whose one end is connected to the other terminal of the fourth magnetoresistive element and whose other end is connected to the third terminal, a fifth switching element having a fifth current path whose one end is connected to the one terminal of the fifth magnetoresistive element and whose other end is connected to the second bit line, and a sixth switching element having a sixth current path whose one end is connected to the one terminal of the sixth magnetoresistive element and whose other end is connected to the second bit line.

6. The memory according to claim 1, wherein the first magnetoresistive elements, the second magnetoresistive element, the third magnetoresistive element, the fourth magnetoresistive element, the fifth magnetoresistive element, and the sixth magnetoresistive element have the same shape and structure.

7. The memory according to claim 1, wherein the plurality of first magnetoresistive elements are arranged in a matrix in a memory cell array region, the second magnetoresistive element is present in the memory cell array region, the third magnetoresistive element is present in the memory cell array region, the fourth magnetoresistive element is present in the memory cell array region, the fifth magnetoresistive element is present in the memory cell array region, and the sixth magnetoresistive element is present in the memory cell array region.

8. The memory according to claim 1, wherein in a read operation, a read current flows to one of the first magnetoresistive elements and the second magnetoresistive element in different directions, a read current flows to a set of the third magnetoresistive element and the fourth magnetoresistive element and a set of the fifth magnetoresistive element and the sixth magnetoresistive element in different directions, and a read current flows to the second magnetoresistive element and a set of the fifth magnetoresistive element and the sixth magnetoresistive element in the same direction.

9. The memory according to claim 3, wherein each of the first switching elements, the second switching element, the third switching element, the fourth switching element, the fifth switching element, and the sixth switching element is formed from one of a transistor and a diode.

10. The memory according to claim 1, further comprising:

write bit lines which are provided near the first magnetoresistive elements and the second magnetoresistive element, wherein the first and second bit lines are a read bit line.

11. The memory according to claim 1, wherein the second magnetoresistive element, the fifth magnetoresistive element, and the sixth magnetoresistive element are recorded in the same date.

* * * * *